US008385391B2

(12) United States Patent
Balasubramanian et al.

(10) Patent No.: US 8,385,391 B2
(45) Date of Patent: Feb. 26, 2013

(54) CLOSED-LOOP RECEIVER FEEDBACK PRE-DISTORTION

(75) Inventors: Rama Balasubramanian, Carlsbad, CA (US); Mark J. Miller, Vista, CA (US); Charles N. Pateros, Carlsbad, CA (US)

(73) Assignee: ViaSat, Inc., Carlsbad, CA (US)

( * ) Notice: Subject to any disclaimer, the term of this patent is extended or adjusted under 35 U.S.C. 154(b) by 1181 days.

(21) Appl. No.: 11/549,074

(22) Filed: Oct. 12, 2006

(65) Prior Publication Data

US 2007/0153884 A1 Jul. 5, 2007

Related U.S. Application Data

(60) Provisional application No. 60/726,393, filed on Oct. 13, 2005.

(51) Int. Cl.
*H04B 1/38* (2006.01)
*H04L 5/16* (2006.01)

(52) U.S. Cl. ...................................... 375/219

(58) Field of Classification Search ............... 375/219, 375/296
See application file for complete search history.

(56) References Cited

U.S. PATENT DOCUMENTS

| 6,118,811 | A  | * | 9/2000  | Narumi et al.  | 375/219  |
|-----------|----|---|---------|----------------|----------|
| 6,775,330 | B2 |   | 8/2004  | Bach et al.    |          |
| 6,798,843 | B1 |   | 9/2004  | Wright et al.  |          |
| 7,146,138 | B2 | * | 12/2006 | Anvari         | 455/114.3|
| 7,363,563 | B1 | * | 4/2008  | Hissen et al.  | 714/733  |
| 7,437,135 | B2 | * | 10/2008 | Pan et al.     | 455/284  |
| 2003/0202615 | A1 | * | 10/2003 | Bach et al.  | 375/296  |
| 2004/0203542 | A1 | * | 10/2004 | Seo et al.   | 455/126  |
| 2004/0268190 | A1 | * | 12/2004 | Kossel et al.| 714/704  |
| 2005/0181739 | A1 | * | 8/2005  | Krasny et al.| 455/69   |

FOREIGN PATENT DOCUMENTS

WO  WO 2007/044957 A2  4/2007

OTHER PUBLICATIONS

R. Balasubramanian and M. Miller, Pre-Distortion Technique and Bandwidth Efficient Modulation for Military Satellite Communications, Oct. 31,-Nov. 3, 2004, Military Communications Conference, 2004. MILCOM 2004. IEEE,1028-1033.*
Office Action of Mar. 24, 2011 for Canadian Patent Application No. 2,625,814, 2 pages.
International Search Report and Written Opinion for PCT Patent Application No. PCT/US2006/040350 mailed on Sep. 25, 2007, 11 pages.

* cited by examiner

*Primary Examiner* — Dac V. Ha
*Assistant Examiner* — Tanmay Shah
(74) *Attorney, Agent, or Firm* — Kilpatrick Townsend & Stockton LLP

(57) ABSTRACT

Methods and systems for calculating pre-distortion coefficients in a closed-loop communication system are presented. Transmission terminals that include high power amplifiers are difficult to operate at or near the saturation point without transmitting signals with nonlinear distortions. By pre-distorting the signal prior to amplification the transmitted nonlinear distortions may be decreased. A closed-looped pre-distortion system may include a receiver that calculates the pre-distortion coefficients and transmits these coefficients back to the transmitter. These coefficients may be stored in a pre-distortion coefficient lookup table and may be updated by the receiver terminal.

26 Claims, 10 Drawing Sheets

CLOSED-LOOP RECEIVER FEEDBACK PRE-DISTORTION

CROSS-REFERENCES TO RELATED APPLICATIONS

This application claims the benefit of U.S. Provisional Application Ser. No. 60/726,393, entitled: CLOSED-LOOP RECEIVER FEEDBACK PRE-DISTORTION, filed Oct. 13, 2005, and is incorporated herein by reference.

BACKGROUND OF THE INVENTION

In bandwidth limited wireless channels, such as QAM systems, higher order modulations can be used to increase data throughput. These higher order systems, however, are more sensitive to channel imperfections, especially nonlinear distortions encountered in practical channels, such as, for example, satellite channels. While there are several sources of nonlinear distortion, a major distortion source are high-power amplifiers (HPA) used at the transmitter. The characteristics of HPAs have nonlinear amplitude and phase characteristics that vary with time. Because of these nonlinear distortions, driving the HPA at or near the saturation power can become problematic. The effects of these nonlinearities may be decreased by using larger output back-offs such as operating in the quasi-linear region, but doing so reduces the output signal level.

A common technique used to minimize both the output back-offs and HPA nonlinearities is to pre-distort the transmitted signal prior to amplification. Pre-distortion performs an inverse of the HPA nonlinearity to make the post amplification signal as close to linear as possible. Two types of pre-distortion techniques have been used in the art: symbol-by-symbol pre-distortion and sample-by-sample pre-distortion. Both of these pre-distortion methods are open-looped inasmuch as neither method receives feedback from the receiving terminal.

In symbol-by-symbol pre-distortion, each modulated symbol is pre-distorted by a certain value. This pre-distortion value may be the average distortion experienced when a particular symbol is transmitted. The distortion for a symbol may also be based on its value and the value of the adjacent few symbols. The pre-distorted symbol may then be filtered, usually by a Square Root Raised Cosine (SRRC) filter for bandwidth shaping and then sent to the HPA for amplification. This pre-distortion method does not require any knowledge of the HPA characteristics.

In sample-by-sample pre-distortion, the digital values at the output of a shaping filter are typically pre-distorted by a certain value, called the pre-distortion coefficients, so as to make the overall channel quasi-linear. These pre-distortion coefficients are dependent on the HPA characteristics. Accordingly, sample-by-sample pre-distortion necessitates either prior knowledge of the HPA characteristics or estimating the HPA characteristics. Because this technique is tied to the specific characteristics of a particular HPA it can provide superior performance over the symbol-by-symbol technique.

BRIEF SUMMARY OF THE INVENTION

In certain embodiments, a closed-loop communication system is provided. Such systems may comprise a first terminal including a pre-distortion multiplication module, a transmitter, and a receiver. These embodiments may also include a second terminal including a receiver, pre-distortion coefficient calculator, and a transmitter. In certain embodiments the first terminal may transmit a signal that is received by the receiver at the second terminal. The second terminal may then calculate pre-distortion coefficients for the first terminal in the pre-distortion calculator by analyzing the signal. The second terminal may then transmit the pre-distortion coefficients back to the first terminal. The first terminal may then receive the pre-distortion coefficients. In some embodiments the first terminal may include a lookup table where the pre-distortion coefficients may be stored. In other embodiments the first terminal may comprise a high power amplifier and/or a digital to analog converter. The signal transmitted by the first terminal may include a known header. In certain embodiments the pre-distortion calculator may calculate the pre-distortion coefficients using a least squares estimation technique or a least mean squares technique. In other embodiments the pre-distortion coefficient multiplication module modifies the signal prior to conversion at the digital-to-analog converter. In other embodiments the module modifies the signal after conversion.

In other embodiments, a closed-loop communications system is also provided comprising a first terminal that includes a receiver that receives at least pre-distortion coefficients, a lookup table that stores pre-distortion coefficients, a pre-distortion multiplication module that modifies a data signal by applying the pre-distortion coefficients stored in the lookup table, an amplifier that amplifies the signal after modification, and a transmitter antenna that transmits the modified and amplified signal. In other embodiments the system may include a second terminal that provides a receiver that receives an analog signal from the first terminal, a pre-distortion coefficient calculator that calculates pre-distortion coefficients based on the received signal, and a transmitter that transmits pre-distortion coefficients. The terminals in these embodiments may communicate via a full duplex channel. In some embodiments the pre-distortion coefficient calculator may calculate pre-distortion coefficients with either least squares estimation technique or a least means squares technique.

In some embodiments a receiver for a closed-loop pre-distortion feedback system is provided that includes a receiver for receiving a signal, a pre-distortion coefficient calculator that calculates pre-distortion coefficients based on the received signal, and a transmitter that transmits pre-distortion coefficients. In some embodiments the pre-distortion coefficient calculator may calculate pre-distortion coefficients with a least squares estimation technique such as least means squares.

Another embodiment includes a transmitter for a closed-loop pre-distortion feedback system that includes a receiver that receives pre-distortion coefficients, and a pre-distortion multiplication module that modifies a signal by applying the pre-distortion coefficients to the signal. In some specific embodiments this transmitter may also include a lookup table for storing pre-distortion coefficients, a high power amplifier and digital-to-analog converter. The digital-to-analog converter may convert a digital signal either before or after the pre-distortion coefficients are applied.

Another embodiment of the invention provides for a closed-loop communication system that includes a plurality of satellite terminals. Each of these terminals may include a pre-distortion multiplication module, a transmitter and a receiver. These satellite terminals may also include a digital-to-analog converter, a high power amplifier, and/or lookup table. Other embodiments may include a second terminal comprising a receiver, pre-distortion coefficient calculator, and a transmitter. In such embodiments, a satellite terminal may transmit a signal that is received at the second terminal.

The pre-distortion calculator calculates pre-distortion coefficients for the satellite terminal from the received signal and transmits the pre-distortion coefficients to the satellite terminal's receiver.

In certain embodiments, a method is provided for calculating pre-distortion coefficients. A signal is received from a source. Pre-distortion coefficients are calculated from the received signal and then transmitted to the source. In some embodiments the signal is a wireless signal. The coefficients may be calculated by calculating the least-squares error between the signal and a model signal or calculating the least mean squares between the signal and a model signal. In other embodiments a least squares estimation technique or a least mean squares technique may be used.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

The present disclosure is described in conjunction with the appended figures.

In the appended figures, similar components and/or features may have the same reference label. Where the reference label is used in the specification, the description is applicable to any one of the similar components having the same reference label.

DETAILED DESCRIPTION OF THE INVENTION

The ensuing description provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment. It is understood that various changes may be made in the function and arrangement of elements without departing from the spirit and scope as set forth in the appended claims.

Embodiments of the invention provide for systems and methods that reduce nonlinear distortions from a communications module, such as for example a satellite transmitter. The embodiments of the invention provide a two terminal closed-loop system that calculates pre-distortion coefficients in one terminal and transmits these coefficients to another terminal. The coefficients may be applied to a signal in order inverse the effects of a nonlinear distortion, such as, for example, by a high power amplifier.

Transmission terminals, such as satellite, often suffer from nonlinear distortions that are caused in many cases when the signal is amplified by the transmission terminal. In some situations the distortion is caused by a high power amplifier. An ideal amplifier increases the power of a signal in a linear fashion. However, in practice amplifiers are not linear across a full power range. While there may be a range where the amplifier operates very closely to linear, at some point, the amplifier becomes saturated and its output ceased to be linear. This point is often called the saturation point or the knee of the amplifier. Near the saturation point, amplifiers operate in the quasi linear region.

An amplifier is most efficient when driven with the highest possible output power. Doing so, however, may drive the amplifier into the nonlinear range, which may produce unpredictable responses. To overcome these limitations the efficiency of the amplifier may be lowered in order to keep the amplifier within the linear zone. Furthermore, pre-distortion coefficients may be calculated and applied to the input signal in order to counteract the nonlinear distortions in the amplifier thus decreasing the nonlinearities of the amplifier.

Figure 1:
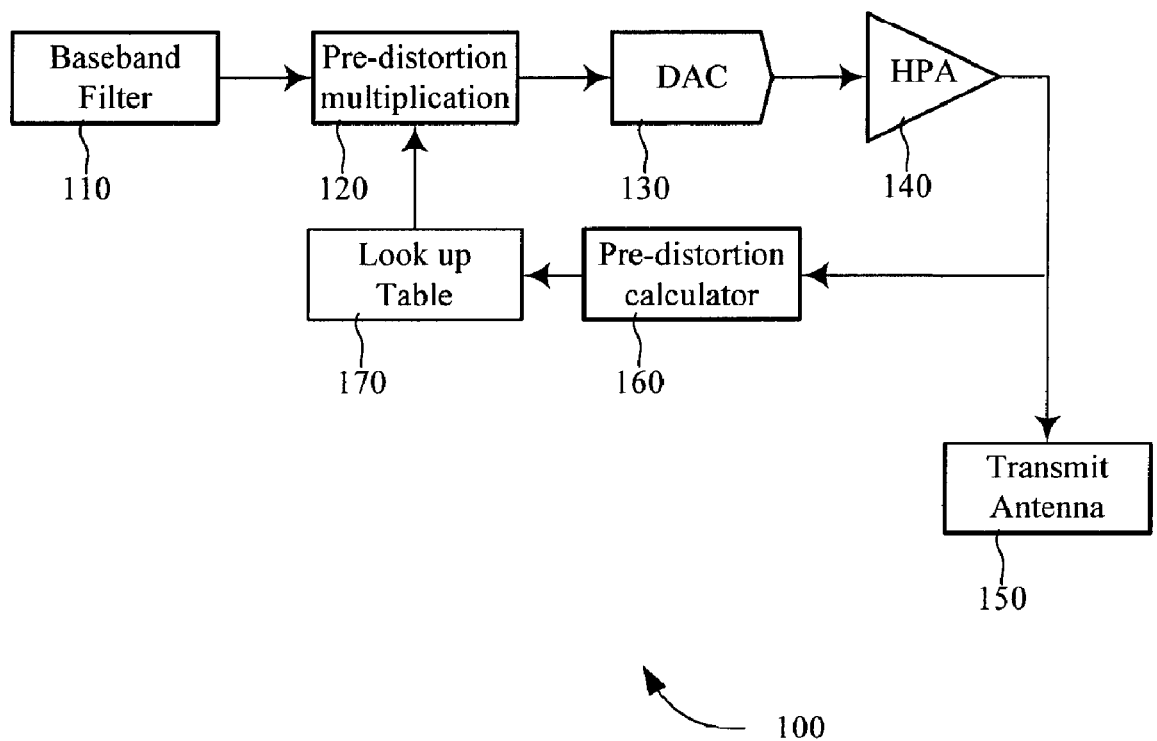
FIG. 1 shows an open-loop pre-distortion transmitter terminal with feedback from the HPA.

FIG. 1 shows an "open-loop" pre-distortion system 100. A local feedback loop is incorporated into the system that calculates pre-distortions coefficients and then applies these coefficients by adjusting the input signal to counteract HPA nonlinearities. These nonlinearities may include both amplitude and phase characteristics that vary with time and may depend on environmental factors. The pre-distortion coefficients may be calculated 160, stored in a lookup table 170 and applied in the same terminal, often a transmitter. Here the coefficients depend on the characteristics of the HPA. The coefficients are applied to the envelope prior to conversion into an analog signal at the digital-to-analog converter 130 and prior to amplification at the HPA 140. Transmitter systems such as these require all coefficient calculations to occur within the transmission terminal. These systems permit the HPA to operate at full power without introduction of nonlinearities.

Figure 2:
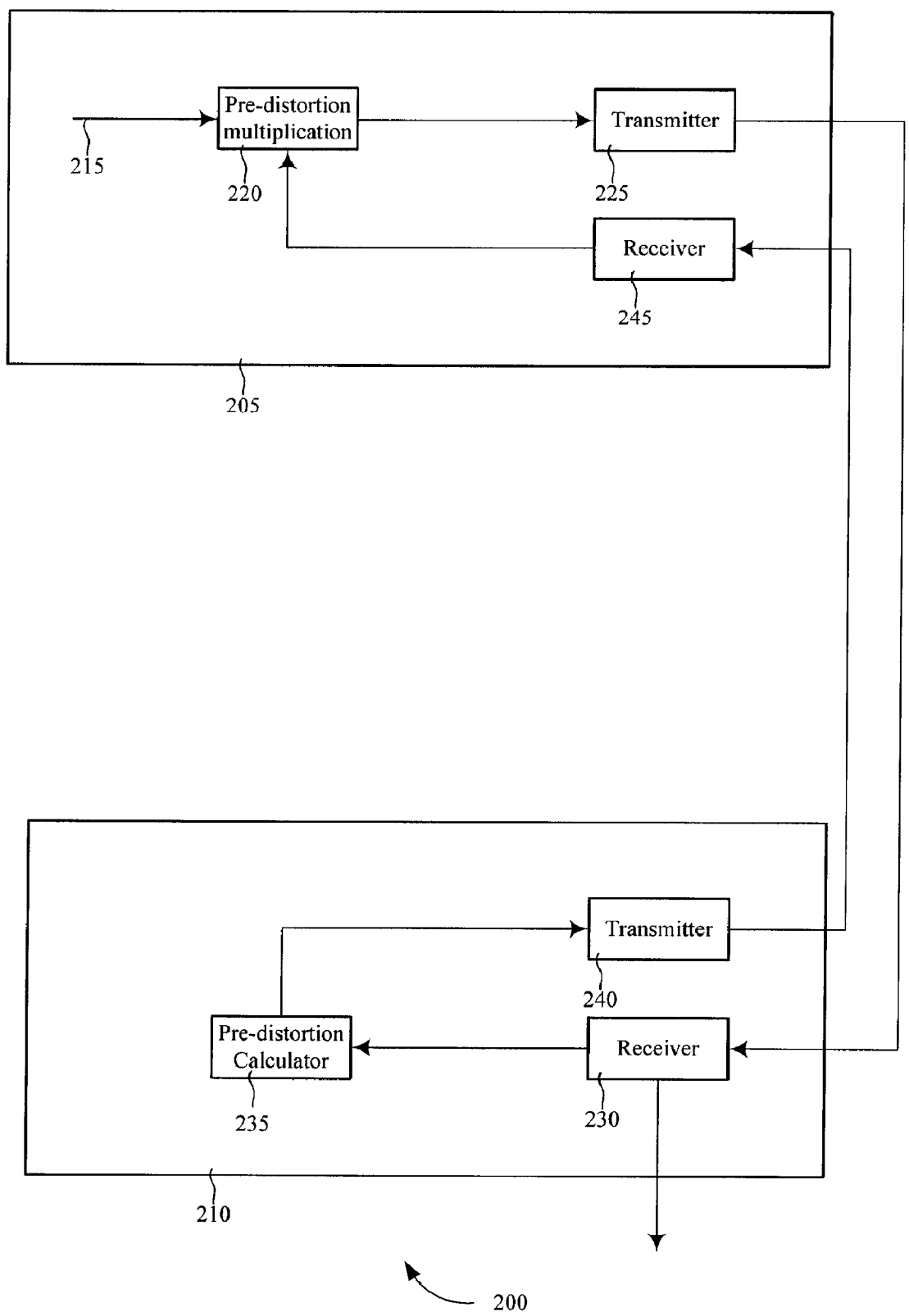
FIG. 2 shows a closed-loop pre-distortion system with the pre-distortion coefficients calculated at a second terminal and applied at first terminal according to an embodiment of the present invention.

FIG. 2 shows a closed-loop pre-distortion system 200 with two terminals according to one embodiment of the invention: a first terminal 205 and second terminal 210. The pre-distortion coefficients for the first terminal may be calculated at the second terminal 210. A data signal 215 is received at first terminal 205. Prior to transmission from first terminal 205 the signal may be pre-distorted at the pre-distortion multiplication module 220. The signal may then be transmitted at the transmitter 225. The first terminal may include a plurality of elements including but not limited to digital-to-analog converters, amplifiers, antennas, etc. The transmitted signal may then be received by the receiver 230 at the second terminal 210. Pre-distortion coefficients may then be calculated by the pre-distortion coefficient calculator 235 within the second terminal 210. These coefficients may then be transmitted via transmitter 240 in the second terminal and received by the receiver 245 in the first terminal 205. These coefficients may then be used within first terminal 205 to pre-distort a received signal prior to transmission in order to negate nonlinear distortions in the first terminal.

Figure 3:
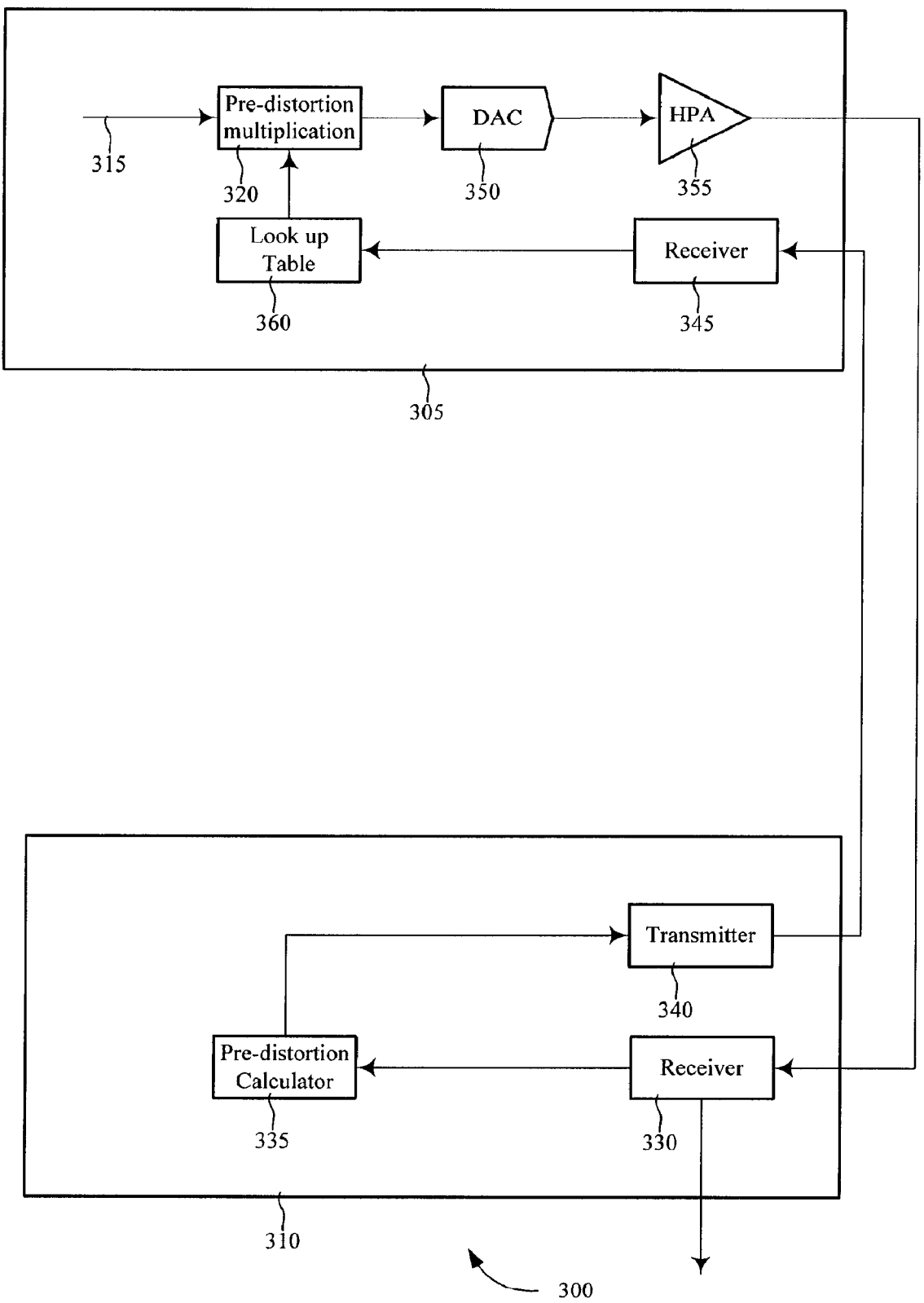
FIG. 3 shows the closed-loop pre-distortion system of FIG. 2 with a digital to-analog-converter (DAC), a lookup table, and a high power amplifier (HPA) in the transmitter terminal according to an embodiment of the present invention.

FIG. 3 shows a closed-loop pre-distortion system 300 according to another embodiment of the present invention. In this embodiment first terminal 305 also includes a digital-to-analog converter (DAC) 350, a high power amplifier (HPA) 355 and a lookup table 360. In transmitters, the HPA 355 may often be a major source of nonlinearities found in the transmitted signal. When the HPA 355 operates in the quasi-linear region nonlinearities may occur. Rather than reduce the nonlinearities by using output back offs, which also lower the output power, the signal may be pre-distorted prior to amplification in order to perform the inverse of the HPA nonlinearity and thus make the channel much closer to linear.

Figure 4:
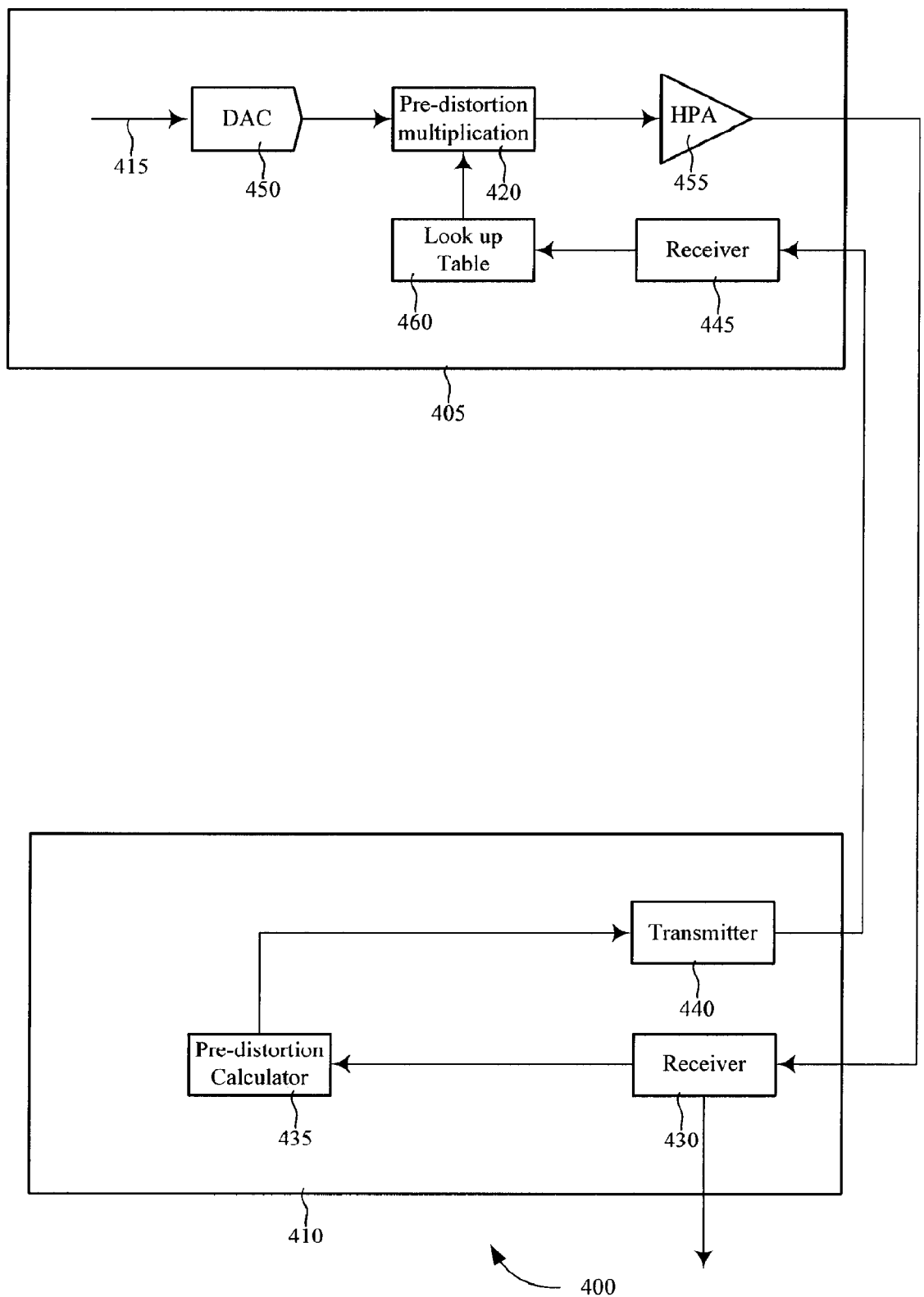
FIG. 4 shows the closed-loop system of FIG. 3 with the pre-distortion multiplication occurring after conversion from the DAC according to another embodiment of the invention.

The HPA 355, for example, may be a traveling wave tube or a GaAs FET amplifier. The pre-distortion coefficients may be calculated by the pre-distortion calculator 335 at second terminal 310, and transmitted by the transmitter 340 to first terminal 305. The coefficients may then be stored in a lookup table 360 and then applied to the signal prior to amplification in order to minimize nonlinear distortions from the HPA 355. First terminal 305 receives a digital signal 315, modifies by applying pre-distortion coefficients, converts the signal from digital-to-analog at the DAC 350 and then amplifies the signal at the HPA 355. FIG. 4 shows a similar closed-loop pre-distortion system 400. In this embodiment the pre-distortion 420 occurs after conversion from digital-to-analog at the DAC 450.

In any of the embodiments discussed, the first and second terminals and may be located at geographically remote locations. The terminals may also be wirelessly connected or connected by wire. For example, the first terminal may be located on a satellite and the second terminal may be a gateway, which acts as a central hub in communication with a plurality of satellites. As another example, the first terminal may be a wireless or cellular telephone and the second terminal may be a wireless or cellular tower. In these two examples the gateway and the wireless or cellular tower, may calculate the pre-distortion coefficients for a plurality of satellites, cell phones, wireless phones or the like.

Moreover, as another example, the first terminal may include an HPA 355 and an antenna that are situated far away from the transmitter where close-loop or direct feedback loops are difficult or completely unavailable. In such examples, a second terminal may be employed to calculate the pre-distortion coefficients for the first-terminal. In some examples calculating these coefficients may be the second terminals sole purpose. In this configuration the second terminal may not be geographically distinct from the first terminal and may be local and/or part of a larger subsystem.

The second terminal may, for example, be an advantaged terminal. An advantaged terminal is a terminal that has capabilities beyond that of a normal terminal and generally is not meant to be a recipient of the transmitted data. An advantaged terminal may be part of the transmitting terminal or another terminal that may calculate and send pre-distortion coefficients back to the first terminal. The second terminal may also be a disadvantaged terminal; that is, a normal terminal that is also the recipient of the data. The second, advantaged terminal, for example, may include a large dish satellite antenna such as at a transmitting hub or a network control center for a mesh satellite network.

The amplifier 355 may comprise, for example, a transistor, a vacuum tube, an op-amp, a bipolar junction transistor, a power amplifier, a high power amplifier, a traveling wave tube, a klystron, a field effect transistor, and/or a MOSFET. Other amplifiers may also be employed without deviating from the scope of the invention.

Pre-distortion coefficients may be calculated in a number of ways. In one embodiment, a first terminal transmits a known file stream, for example, a known header stream of data. The pre-distortion calculator may then compare the received data from the first terminal with the known data. Based on this information the pre-distortion coefficient calculator may calculate pre-distortion coefficients to compensate for any distortion in the signal. In other embodiments the pre-distortion coefficient calculator does not require a known data stream to calculate the coefficients (for example, when the second terminal is an advantaged terminal). Because the HPA nonlinearities may not distort the transmitted signal beyond recognition, the receiver (especially at an advantaged terminal) may be capable of demodulating the signal regardless of the distortions from the HPA. Thus, the pre-distortion calculator may calculate pre-distortion coefficients based what was received.

The pre-distortion calculator may calculate both initial pre-distortion coefficients and/or adaptive pre-distortion coefficients. The initial pre-distortion coefficients may be estimated based on basic physical parameters of the system. Initial pre-distortion coefficients may be used to provide reasonably good coefficients to begin with. Adaptive pre-distortion coefficients may be calculated to refine and more accurately minimize distortions in the signal.

Initialization of pre-distortion coefficients may be performed using a least square estimation (LSE) technique. Although the LSE technique is described herein, the invention is not limited to this technique. Indeed, many other mathematical and/or numerical techniques may be employed to determine the pre-distortion coefficients. Using the LSE technique the HPA characteristic may be modeled, for example, using AM/AM and AM/PM functions. These functions work well as a model for the HPA because they are monotonically increasing functions that are similar to the response of an HPA. Other appropriate functions with similar characteristics may also be used to model the HPA characteristics. The AM/AM function may be modeled as an odd polynomial function of the input signal amplitude and the AM/PM may be modeled as a general polynomial function of the input amplitude without the $0^{th}$ order term. In some embodiments the AM/PM may be modeled as an even polynomial function of the input amplitude, including the $0^{th}$ order term. Simulations have shown that including the $0^{th}$ order term in the AM/PM may make the LSE very sensitive to receiver noise.

The pre-distortion coefficients are updated with the following specific embodiment of the present invention. The pre-distortion characteristics of the HPA, as discussed above, are modeled with AM/AM and AM/PM polynomial functions. A large or small number of terms may be used. In some cases a good first estimate of the pre-distortion coefficients may be sufficient for initialization and the coefficients may then be adaptively updated after initialization. Doing so may cut down on computation time and resources. Accordingly, in this embodiment of the invention, a small number of terms are used to initialize the coefficients, for example with 4-5 terms. The AM/AM and AM/PM polynomials may have n and m terms respectively as:

$$A(r) = a_0 r^1 + a_1 r^3 + \ldots + a_{n-1} r^{2n-1}$$

$$\Phi(r) = \phi_1 r^1 + \phi_2 r^2 + \ldots + \phi_m r^m \qquad \text{Eq. 1}$$

The LSE is obtained by minimizing the squared error between the model and the actual received data.

$$\underline{a}=[a_0\ a_1\ \ldots\ a_{n-1}]^t$$

$$\underline{\phi}=[\phi_1\ \phi_2\ \ldots\ \phi_m]^t$$

Let the number of received samples be denoted by L. Let $y_k$ be the $k^{th}$ complex sample received at second terminal corrupted by non-linear distortion and receiver noise. Let $x_k$ be the complex sample prior to distortion and transmission at first terminal. Let $r_k=abs(x_k)$, where $abs(z)$ is the absolute value of the complex number z.

The LSE of the AM/AM polynomial coefficients (denoted by the subscript LS) may be given by $$\underline{a}_{LS}=(H_a^t H_a)^{-1} H_a z_a \quad \text{Eq. 2}$$

$$(H_a^t H_a)_{i,j} = \sum_{k=0}^{L-1} r_k^{(2i+1)+(2j+1)}$$

$$(H_a z_a)_i = \sum_{k=0}^{L-1} r_k^{2i+1} |y_k|$$

In the above equations, the indices i and j vary from 0 to n−1. Thus, the matrix given by the second equation above is of size n×n and the vector given by the third equation is size n×1.

The LSE estimate of the AM/PM polynomial coefficients (again denoted by the subscript LS) may given by $$\underline{\phi}_{LS}=(H_\phi^t H_\phi)^{-1} H_\phi z_\phi \quad \text{Eq. 3}$$

$$(H_\phi^t H_\phi)_{i,j} = \sum_{k=0}^{L-1} r_k^{(i+1)+(j+1)}$$

$$(H_\phi z_\phi)_i = \sum_{k=0}^{L-1} r_k^{j+1} \text{Arg}(y_k x_k^*)$$

In the above equations, the indices i and j vary from 0 to m−1. Thus, the matrix given by the second equation above is of size m×m and the vector given by the third equation is size m×1.

Figure 6:
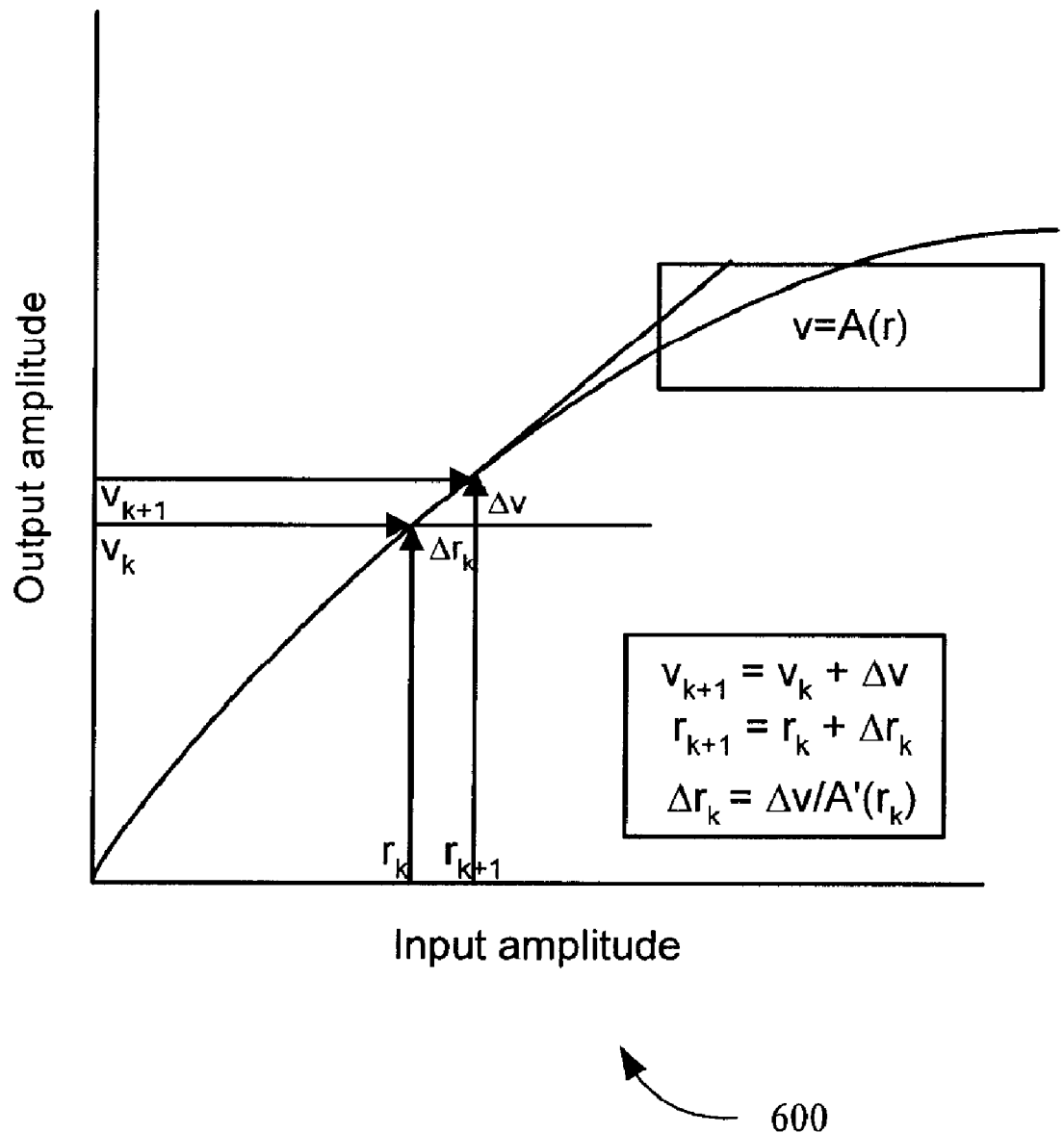
FIG. 6 shows a plot of a recursive calculation algorithm for adapting pre-distortion coefficients from a least-squares polynomial estimate according to one embodiment of the invention.

According to this specific embodiment, the pre-distortion table may be generated by the following steps: 1) Let v=A(r) be the AM/AM function where r is the signal at first terminal and v is the received distorted signal at the receiver. The goal of LSE is to determine the values of r that correspond with v. 2) Calculate A'(r) as the first derivative of A(.) evaluated at r. A'(r) should be easy to compute because A(.) is a polynomial in r. 3) Initialize the table with $r_0=0$ and $v_0=0$, because when the input signal to the transmitter is zero the output signal is also zero. 4) Calculate the AM/AM values recursively as shown by the graph of input vs. output amplitude 600 in FIG. 6. 5) Stop the recursion when $|A'(r_k)|<\epsilon$ or $v_{k+1}>10^{HPA\_OBO/20}$. Note that the peak power is normalized to one, E is a suitably small number, and HPA_OBO is the peak power OBO of the high power amplifier. 6) The AM/AM pre-distortion for $v_k$ may then be given by $r_k/v_k$, i.e., if $v_k$ is the envelope of the signal to be transmitted, the AM/AM pre-distortion is $r_k/v_k$. 7) The AM/PM pre-distortion may then be computed using the AM/PM polynomial and the AM/AM table generated above. Because the pre-distortion power, independent of the pre-distortion phase, distorts both the amplitude and the phase of the distorted received signal, once the correlation between the pre-distortion power and the received distorted power has been made, the phase distortion may also be found.

Once the relationship between the pre-distorted power and the received distorted power has been made and pre-distortion coefficients found, the pre-distortion coefficient table may be sent to first terminal. The table as a whole may be transmitted to first terminal. In other embodiments individual table entries may be transmitted to first terminal. The pre-distortion multiplication module may store the pre-distortion coefficients in a lookup table in first terminal. When the pre-distortion multiplication module receives a signal it transmits the signal to the amplifier with the most appropriate power to achieve proper amplification without distortion. The pre-distortion coefficient lookup table may include an input signal magnitude that is mapped to a LUT address. To drive the open loop gain to unity, the pre-distortion function's coefficients are updated by dividing each coefficient by the calculated open loop gain.

Figure 7:
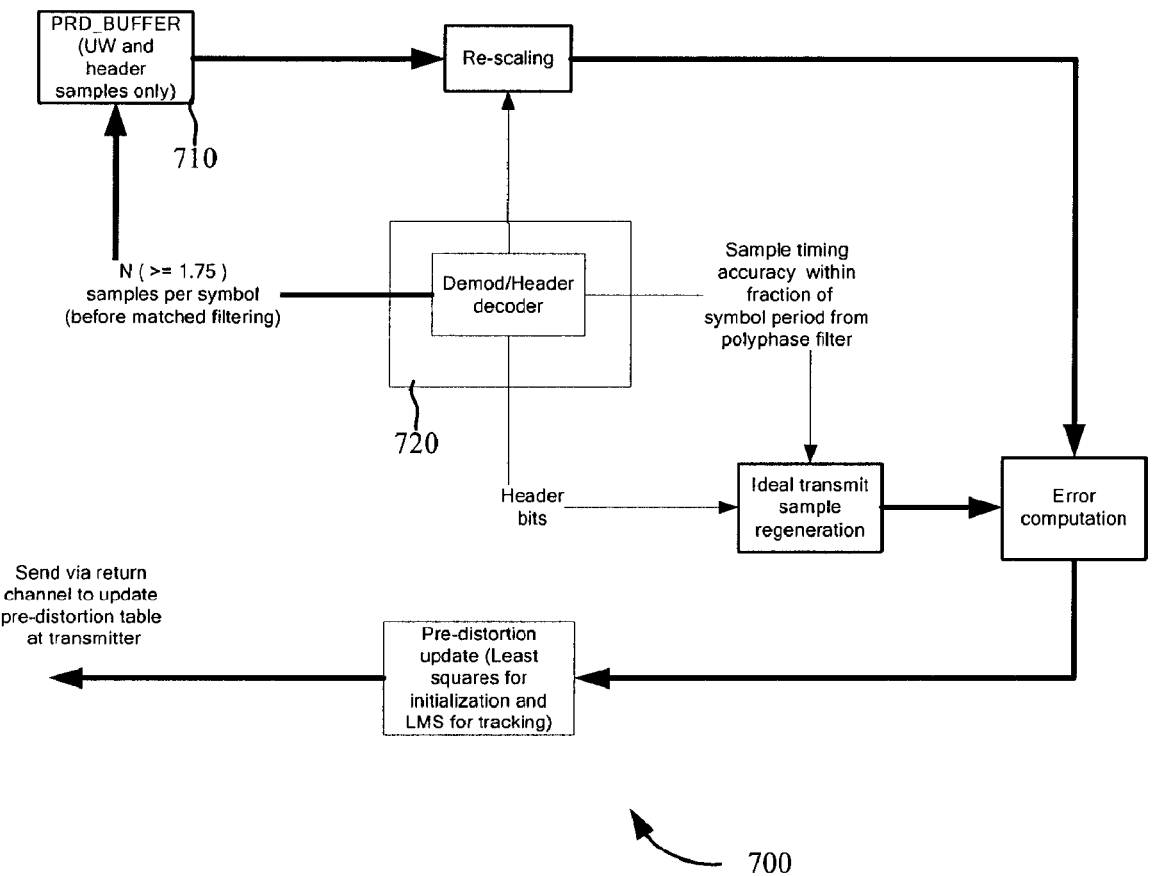
FIG. 7 shows a block diagram of a pre-distortion coefficient estimation according to another embodiment of the invention.

FIG. 7 shows a pre-distortion coefficient tracking loop according to one embodiment of the invention. Once the initialized coefficients are found and implemented, the system may then adaptively update the pre-distortion coefficients. A least mean squares (LMS) technique may be used to adapt the coefficients. Other techniques may also be used that find and minimize the difference between the pre-amplified and sent signal in order to find the pre-distortion coefficients, for example, a recursive LSE algorithm as well as correlation techniques.

FIG. 7 shows a tracking loop 700 based on the LMS adaptation algorithm according to another embodiment of the invention. The tracking loop 700 shows an adaptation algorithm that modifies pre-distortion coefficients. Using an adaptation algorithm may not require modeling of the amplifier characteristics. Accordingly, such an algorithm may computationally less complex. This embodiment assumes that the signal include a known word or data that can be reliably decoded. The received signal is first stored in a buffer 710. A demodulator 720 may supply symbol timing offset corresponding to the first sample in the buffer. The algorithm regenerates samples corresponding to the known data and then compares them with the received samples. The algorithm may regenerate samples by applying pre-distortion coefficients to a known word or data and comparing the results with what was received. The pre-distortion coefficients may be modified and/or adapted until a strong correlation between the calculated signal and the received signal or until there is a small difference between the calculated and received values.

Figure 8:
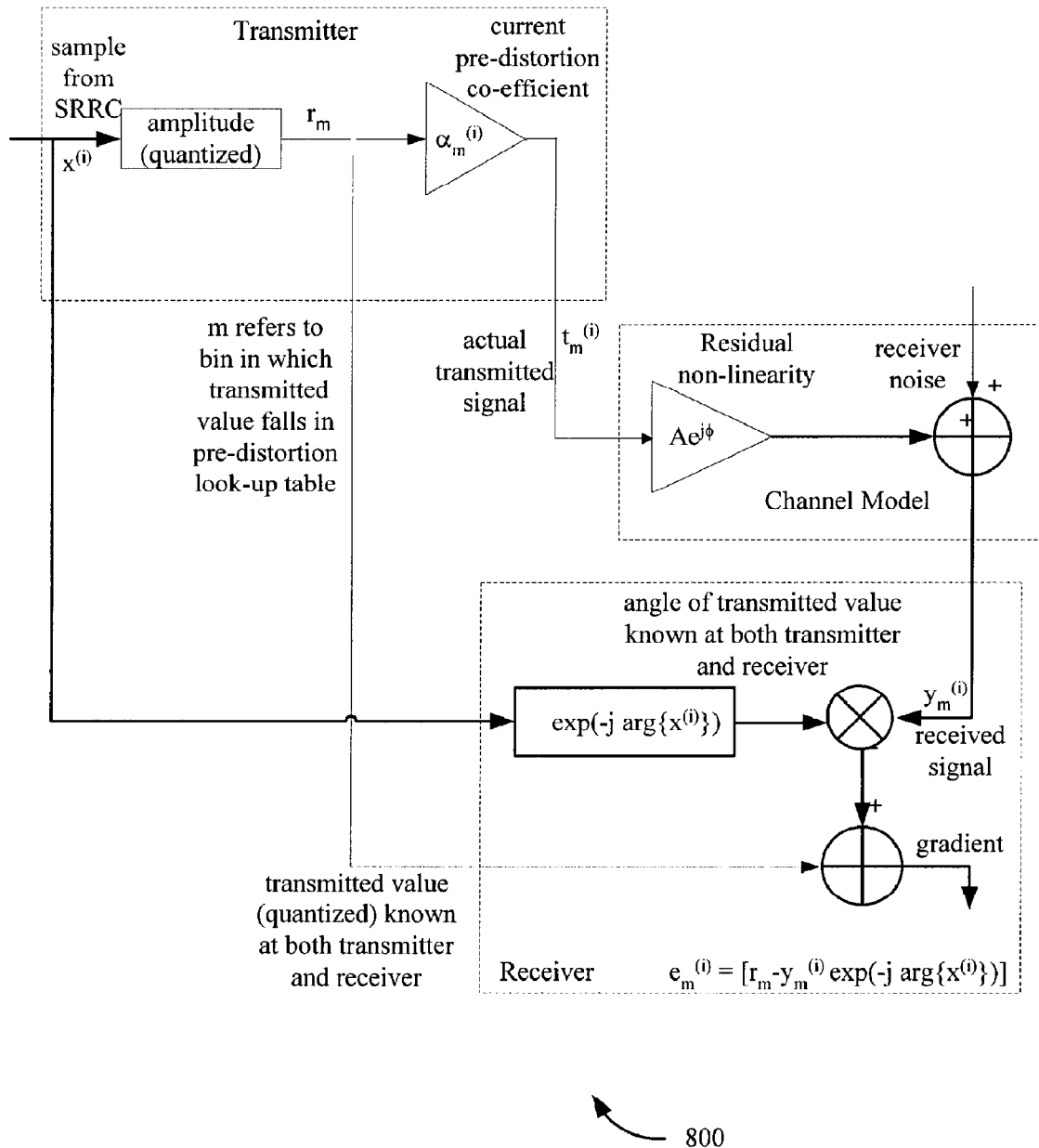
FIG. 8 shows a tracking loop based on a Least Mean Squares adaptation algorithm according to another embodiment of the invention.

FIG. 8 shows a tracking loop 800 based on the LMS adaptation algorithm according to another embodiment of the present invention. In this algorithm the pre-distortion coefficients are calculated directly without estimating the HPA characteristics.

Figure 5:
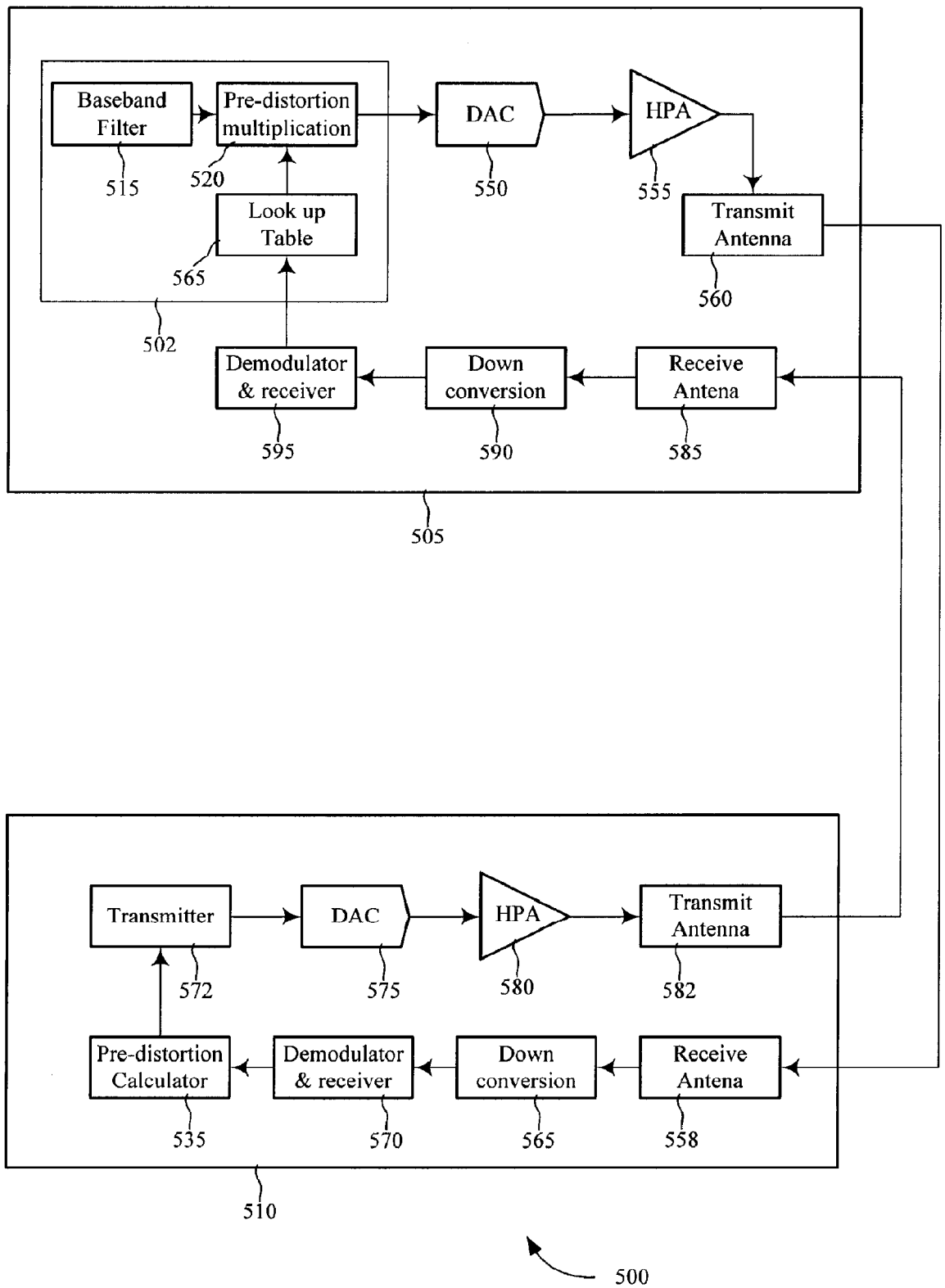
FIG. 5 shows a closed-loop pre-distortion system according to another embodiment of the present invention.

FIG. 5 shows another closed-loop pre-distortion system 500 according to another embodiment of the invention. In this embodiment first terminal 505 includes a transmitter 502. The transmitter 502 further includes a coefficient lookup table 565 and a pre-distortion multiplication module 520. From the transmitter the data is converted from digital-to-analog in the DAC 550 and then amplified by the HPA 555 prior to being transmitted through an antenna 560. The signal is received at second terminal 510 by the receive antenna 558 and may be down-converted 565, demodulated 570, and then the pre-distortion coefficients are calculated 535. Once the coefficients are found they may be transmitted back to first terminal through a transmitter 572, DAC 575, HPA 580 and transmit antenna 582 in second terminal 510. The signal carrying the coefficients may be received at first terminal 505 through receive antenna 585, and then down converted 590, demodulated 595 and stored in the pre-distortion lookup table 565 at first terminal 505.

The second terminal in any of the embodiments, may also include a database to store coefficients. The second terminal may also calculate average coefficients and track how the coefficients change over time. The second terminal may also filter the received signal.

Figure 9:
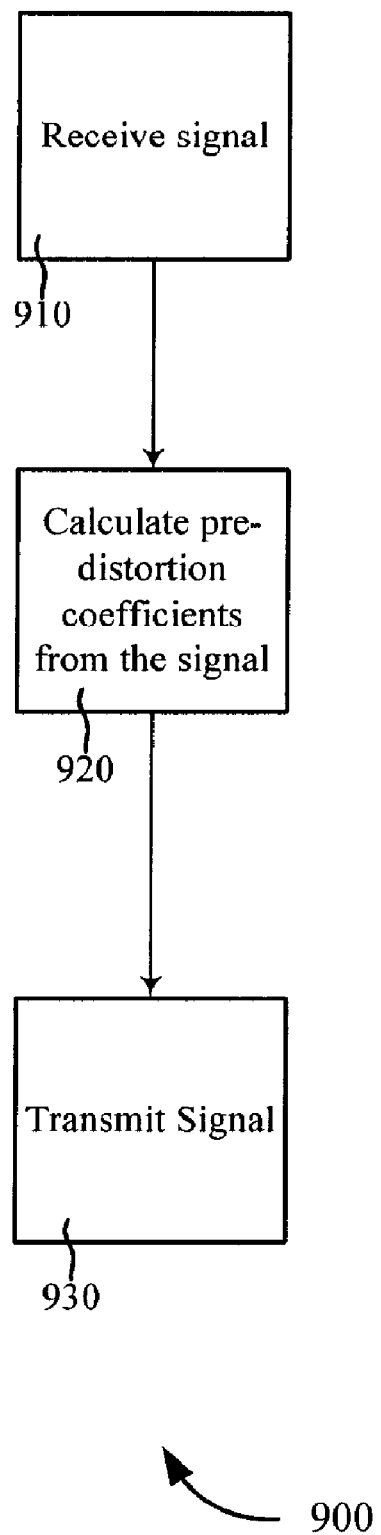
FIG. 9 shows a flow chart representing exemplary steps calculating pre-distortion coefficients according to another embodiment of the invention.

FIG. 9 shows a flow chart 900 representing exemplary steps calculating pre-distortion coefficients at a second terminal. A signal is received form a remote system 910. Pre-distortion coefficients are calculated 920 and these coefficients are then sent to the remote system 930.

Figure 10:
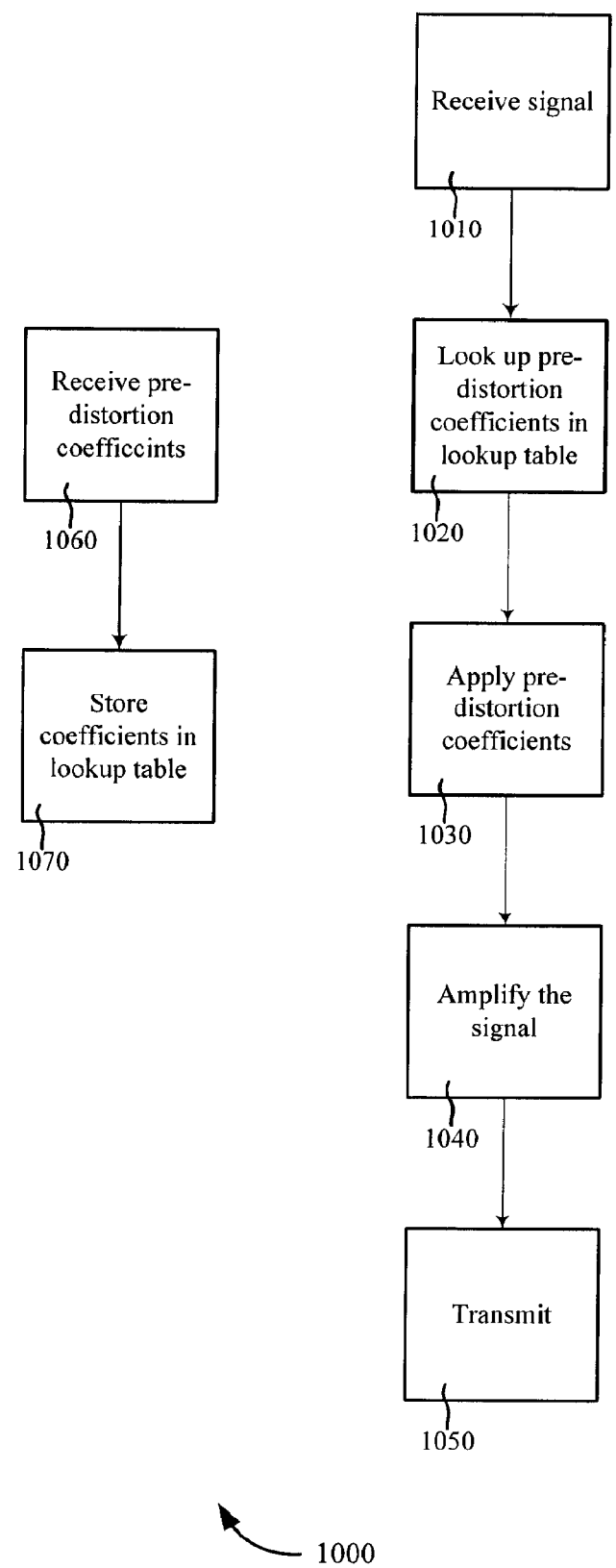
FIG. 10 shows a flow chart representing exemplary steps of a terminal applying pre-distortion coefficients according to another embodiment of the invention.

FIG. 10 shows a flow chart 1000 representing exemplary steps of a terminal applying pre-distortion coefficients. A signal is received 1010. Pre-distortion coefficients are found in the lookup table corresponding to the received signal 1020. Pre-distortion coefficients are applied to said signal 1030. The signal is amplified 1040 and transmitted 1050. Other steps may be included, such as, for example, analog-to-digital conversion. Pre-distortion coefficients are also received at the terminal 1060 and stored in a lookup table 1070. These steps 1060 and 1070 are shown occurring independently of the previous steps and may occur whether or not the other steps are occurring.

In some embodiments of the invention the pre-distortion coefficients are sent to the first terminal at set intervals. In other embodiments the coefficients are sent and updated as often as the pre-distortion coefficient calculator has new coefficients to send to first terminal. In other embodiments the coefficients are transmitted to first terminal in a nearly continuous fashion. The coefficients may also be estimated and/or adapted in real-time. In other embodiments, the AM/AM and AM/PM pre-distortion coefficients may be combined into a single complex pre-distortion coefficient prior to transmission to first terminal. In yet another embodiment, first terminal may send an initialization signal to second terminal and then wait to send the actual signal until pre-distortion coefficients are updated. The initialization signal may include a known signal header to aid in pre-distortion coefficient calculation.

Coefficients may be sent to first terminal in any number of uplink methods, such as, for example, a full duplex link. Wireless radio transmission may also be used for either uplink or downlink. Wired Ethernet or telephone link may also be used for either uplink or downlink. The uplink portion of the communication link may have a limited band width as compared with the downlink. The coefficients may be sent from the second terminal to the first terminal through a wired connection while the downlink from the first terminal may be a wireless link and vice versa. In some embodiments, any upper layer protocol may also be used. Finally, any communication method may be used to send the data between the terminals without deviating from the scope of the invention.

The embodiments of the present invention may be implemented in a satellite network. The first terminal may be a satellite in communication with a second terminal, which may be a satellite gateway. There may also be a variety of satellites in communication with the gateway. By implementing the embodiments of the invention by calculating the HPA coefficients at the gateway rather than in each individual satellite, the cost and resources on the each satellite may be decreased.

The embodiments of the present invention may also be implemented in any variety of communications systems. These systems may include, for example, cellular communication systems, QAM radio systems, and/or wireless telephone systems.

Many of the embodiments of the invention discuss compensation for nonlinearities in a transmission signal. The system may be employed to compensate for any distortions that are applied to a transmit signal from generation at the transmitter until reception at the receiver. Those skilled in the art will recognize the bountiful utility of such an invention.

Specific details are given in the above description to provide a thorough understanding of the embodiments. However, it is understood that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

Implementation of the techniques, blocks, steps and means described above may be done in various ways. For example, these techniques, blocks, steps and means may be implemented in hardware, software, or a combination thereof. For a hardware implementation, the processing modules may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described above, and/or a combination thereof.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

Furthermore, embodiments may be implemented by hardware, software, scripting languages, firmware, middleware, microcode, hardware description languages, and/or any combination thereof. When implemented in software, firmware, middleware, scripting language, and/or microcode, the program code or code segments to perform the necessary tasks may be stored in a machine readable medium such as a storage medium. A code segment or machine-executable instruction may represent a procedure, a function, a subprogram, a program, a routine, a subroutine, a module, a software package, a script, a class, or any combination of instructions, data structures, and/or program statements. A code segment may be coupled to another code segment or a hardware circuit by passing and/or receiving information, data, arguments, parameters, and/or memory contents. Information, arguments, parameters, data, etc. may be passed, forwarded, or transmitted via any suitable means including memory sharing, message passing, token passing, network transmission, etc.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory. Memory may be implemented within the processor or external to the processor. As used herein the term "memory" refers to any type of long term, short term, volatile, nonvolatile, or other storage medium and is not to be limited to any particular type of memory or number of memories, or type of media upon which memory is stored.

Moreover, as disclosed herein, the term "storage medium" may represent one or more devices for storing data, including read only memory (ROM), random access memory (RAM), magnetic RAM, core memory, magnetic disk storage mediums, optical storage mediums, flash memory devices and/or other machine readable mediums for storing information. The term "machine-readable medium" includes, but is not limited to portable or fixed storage devices, optical storage devices, wireless channels, and/or various other mediums capable of storing, containing or carrying instruction(s) and/or data.

While the principles of the disclosure have been described above in connection with specific apparatuses and methods, it is to be clearly understood that this description is made only by way of example and not as limitation on the scope of the disclosure.

What is claimed is:

1. A two-terminal closed-loop satellite communication system where pre-distortion coefficients are calculated for a first terminal at a second remote terminal, comprising:
   a first terminal, wherein said first terminal comprises:
   a pre-distortion multiplication module,
   a transmitter, and
   a receiver; and
   a second terminal, wherein said second terminal comprises:
   a receiver,
   a pre-distortion coefficient calculator, and
   a transmitter,
   wherein:
   said first terminal is located in a geographically distinct location from said second terminal;
   said first terminal prepares and transmits a signal to said second terminal through a satellite communication channel;
   said signal is distorted by said first terminal prior to transmission to said second terminal and by said satellite communication channel;
   said transmitted signal is received at the receiver of said second terminal through the satellite communication channel;
   said pre-distortion calculator determines the pre-distortion coefficients by demodulating and decoding the signal received from the first terminal, regenerating an ideal signal from the demodulated and decoded signal, comparing said ideal signal to said received signal, and calculating said pre-distortion coefficients based on said comparison, said pre-distortion coefficients being calculated for use at said first terminal, wherein said pre-distortion coefficients correct for distortions caused by the environment;
   said second terminal transmits said pre-distortion coefficients to said receiver at said first terminal through the satellite communication channel;
   said receiver at said first terminal receives said pre-distortion coefficients through the satellite communication channel; and
   said first terminal applies said pre-distortion coefficients to subsequently transmitted signals.

2. The two-terminal closed-loop satellite communications system recited in claim 1, wherein said first terminal further comprises a lookup table where said pre-distortion coefficients are stored.

3. The two-terminal closed-loop satellite communications system recited in claim 1, wherein said first terminal further comprises a high power amplifier.

4. The two-terminal closed-loop satellite communications system recited in claim 1, wherein said first terminal further comprises a digital-to-analog converter.

5. The two-terminal closed-loop satellite communications system recited in claim 1, wherein said signal comprises a known header.

6. The two-terminal closed-loop satellite communications system recited in claim 1, wherein said pre-distortion calculator calculates said pre-distortion coefficients using a least squares estimation algorithm.

7. The two-terminal closed-loop satellite communications system recited in claim 1, wherein said pre-distortion calculator calculates said pre-distortion coefficients using a least mean squares algorithm.

8. The two-terminal closed-loop satellite communications system recited in claim 4, wherein said pre-distortion coefficient multiplication module modifies said signal prior to conversion at said digital-to-analog converter.

9. The two-terminal closed-loop satellite communications system recited in claim 4, wherein said pre-distortion coefficient multiplication module modifies said signal after conversion at said digital-to-analog converter.

10. A two-terminal closed-loop satellite communications system, said two-terminal closed-loop satellite communications system comprising:
    a first terminal; and
    a second terminal;
    wherein:
    said first terminal comprises a receiver, wherein said receiver receives pre-distortion coefficients from said second terminal through a satellite communication channel, and wherein said pre-distortion coefficients correct for distortions caused by the environment;
    said first terminal comprises a lookup table, wherein said lookup table stores pre-distortion coefficients received at said receiver;
    said first terminal comprises a pre-distortion multiplication module, wherein said pre-distortion multiplication module modifies a data signal by applying said pre-distortion coefficients;
    said first terminal comprises an amplifier, wherein said amplifier amplifies a signal after modification at said pre-distortion multiplication module;
    said first terminal comprises a transmitter antenna, wherein said transmitter antenna transmits said signal through the satellite communication channel;
    said second terminal comprises a receiver, wherein said receiver receives a signal from said first terminal through the satellite communication channel;
    said second terminal comprises a pre-distortion coefficient calculator, wherein said pre-distortion coefficient calculator determines pre-distortion coefficients by demodulating and decoding the signal received from the first terminal, regenerating an ideal signal based on said demodulated and decoded signal, comparing said ideal signal to said received signal, and calculating said pre-distortion coefficients based on said comparison; and said second terminal comprises a transmitter, wherein said transmitter transmits said pre-distortion coefficients to said receiver located at said first terminal through the satellite communication channel.

11. The two-terminal closed-loop satellite communications system recited in claim 10, wherein said first and second terminals communicate via a full duplex channel.

12. The two-terminal closed-loop satellite communications system recited in claim 10, wherein said first terminal further comprises a digital-to-analog converter.

13. The two-terminal closed-loop satellite communications system recited in claim 10, wherein said signal comprises a known header.

14. The two-terminal closed-loop satellite communications system recited in claim 10, wherein said pre-distortion calculator calculates said pre-distortion coefficients using a least squares estimation algorithm.

15. The two-terminal closed-loop satellite communications system recited in claim 10, wherein said pre-distortion calculator calculates said pre-distortion coefficients using a least mean squares algorithm.

16. A terminal for a closed-loop satellite pre-distortion feedback system, wherein said terminal comprises:
a receiver module;
a pre-distortion coefficient calculation module; and
a transmitter module,
wherein:
said receiver module is adapted to receive transmitted signals from at least one source terminal through a satellite communication channel;
said terminal is located in a geographically distinct location from said at least one source terminal;
said pre-distortion coefficient calculation module is adapted to determine pre-distortion coefficients for said at least one source terminal by demodulating and decoding a signal received at said receiver from one of the at least one source terminals, regenerating an ideal signal based on the demodulated and decoded signal using a model of a high power amplifier (HPA) of said at least one source terminal, comparing said ideal signal to said received signal, and calculating said pre-distortion coefficients based on said comparison, wherein said pre-distortion coefficients correct for distortions caused by the environment; and
said transmitter module is adapted to transmit said pre-distortion coefficients to said source terminal through the satellite communication channel.

17. The terminal for a closed-loop satellite pre-distortion feedback system according to claim 16, wherein said pre-distortion calculation module uses a least squares estimation algorithm to initialize said pre-distortion coefficients.

18. The terminal for a closed-loop satellite pre-distortion feedback system according to claim 16, wherein said pre-distortion calculation module uses a least mean squares adaptation algorithm to calculate said pre-distortion coefficients.

19. A closed-loop satellite communication system, wherein said closed-loop satellite communication system comprises:
a plurality of satellite terminals; and
a gateway terminal;
wherein:
each satellite terminal comprises a pre-distortion multiplication module;
each satellite terminal comprises a high power amplifier;
each satellite terminal comprises a transmitter module;
each satellite terminal comprises a receiver module;
said gateway terminal comprises a receiver;
said gateway terminal comprises a pre-distortion coefficient calculation module;
said gateway terminal comprises a transmitter;
a unique satellite terminal of said plurality of satellite terminals transmits a signal through a satellite communication channel that is received by said receiver at said gateway terminal;
said pre-distortion calculation module determines pre-distortion coefficients for the unique satellite terminal by demodulating and decoding the signal received by the receiver from the unique terminal, regenerating an ideal signal based on the demodulated and decoded signal, comparing said ideal signal to said received signal, and calculating said pre-distortion coefficients based on said comparison, wherein said pre-distortion coefficients correct for distortions caused by the environment;
said transmitter at said gateway terminal transmits said pre-distortion coefficients to said receiver module at said unique satellite terminal through the satellite communication channel; and
said receiver module at said unique satellite terminal receives said pre-distortion coefficients through the satellite communication channel.

20. A method for calculating closed-loop satellite pre-distortion coefficients at a location for a remote terminal, wherein said method comprises the steps of:
receiving a signal from a remote terminal at said location, wherein said location is geographically distinct from the remote terminal;
calculating pre-distortion coefficients for application at the remote terminal by demodulating and decoding the signal received from the remote terminal, regenerating an ideal signal from the demodulated and decoded signal using a model of a high power amplifier (HPA) of the remote terminal, comparing said ideal signal to said received signal, and calculating said pre-distortion coefficients based on said comparison, wherein said pre-distortion coefficients correct for distortions caused by the environment; and
transmitting said pre-distortion coefficients calculated in said calculating step back to said remote terminal.

21. The method for calculating closed-loop satellite pre-distortion coefficients for the remote terminal as recited in claim 20, wherein said signal is a wireless signal.

22. The method for calculating closed-loop satellite pre-distortion coefficients for the remote terminal as recited in claim 20, wherein said signal is a wired signal.

23. The method for calculating closed-loop satellite pre-distortion coefficients for the remote terminal as recited in claim 20, wherein said calculating step further comprises calculating the least-squares error between said signal and a model signal.

24. The method for calculating closed-loop satellite pre-distortion coefficients for the remote terminal as recited in claim 20, wherein said calculating step further comprises calculating the least mean squares between said signal and a model signal.

25. The method for calculating closed-loop satellite pre-distortion coefficients for the remote terminal as recited in claim 20, wherein said calculating step further comprises using a least squares estimation algorithm.

26. The method for calculating closed-loop satellite pre-distortion coefficients for the remote terminal as recited in claim 20, wherein said calculating step further comprises using a least mean squares algorithm.

* * * * *